United States Patent
Yamamoto et al.

(10) Patent No.: US 8,106,486 B2
(45) Date of Patent: Jan. 31, 2012

(54) ELECTRONIC APPARATUS WITH AN ELECTRICAL CONDUCTOR IN THE FORM OF A LIQUID AND AN ELECTRICAL INSULATOR WITH A LIGHT-CURING PROPERTY

(75) Inventors: Kouji Yamamoto, Kariya (JP); Hirofumi Higuchi, Okazaki (JP); Masaki Inoue, Obu (JP)

(73) Assignee: DENSO CORPORATION, Kariya (JP)

( * ) Notice: Subject to any disclaimer, the term of this patent is extended or adjusted under 35 U.S.C. 154(b) by 304 days.

(21) Appl. No.: 12/453,459

(22) Filed: May 12, 2009

(65) Prior Publication Data
US 2009/0284905 A1 Nov. 19, 2009

(30) Foreign Application Priority Data
May 14, 2008 (JP) .................. 2008-126931

(51) Int. Cl.
*H01L 29/06* (2006.01)
*H01R 39/00* (2006.01)

(52) U.S. Cl. ............... 257/625; 257/923; 257/E23.178; 439/5; 439/158; 439/178; 439/179; 439/199; 439/201; 439/203; 439/390

(58) Field of Classification Search .......... 257/625, 257/923, E23.178; 439/5, 158, 178, 179, 439/199, 201, 203, 390
See application file for complete search history.

(56) References Cited

U.S. PATENT DOCUMENTS

| | | | | |
|---|---|---|---|---|
| 4,323,914 A | * | 4/1982 | Berndlmaier et al. | 257/713 |
| 5,629,838 A | * | 5/1997 | Knight et al. | 361/782 |
| 7,084,045 B2 | * | 8/2006 | Takayama et al. | 438/455 |
| 7,462,897 B2 | * | 12/2008 | Endo | 257/291 |
| 2007/0158804 A1 | | 7/2007 | Hosoya et al. | |
| 2007/0285959 A1 | * | 12/2007 | Yamazaki | 365/108 |

FOREIGN PATENT DOCUMENTS

| | | |
|---|---|---|
| JP | A-05-136214 | 6/1993 |
| JP | A-07-130793 | 5/1995 |
| JP | A-07-221421 | 8/1995 |
| JP | 2002-246501 A | 8/2002 |
| JP | 2002-324966 A | 11/2002 |
| JP | A-2005-210001 | 8/2005 |
| JP | A-2007-43213 | 2/2007 |

OTHER PUBLICATIONS

Notice of Reasons for Refusal mailed on Mar. 23, 2010 issued from the Japanese Patent Office in the corresponding Japanese patent application No. 2008-126931 (with English translation).

* cited by examiner

*Primary Examiner* — Thanh V Pham
(74) *Attorney, Agent, or Firm* — Posz Law Group, PLC

(57) ABSTRACT

In a method of making an electronic apparatus, electronic devices and a mold are placed in a package such that pads of electronic devices are covered with the mold. An electrical insulator is poured into the package, in which the mold is placed, to fill the package. The mold is removed from the electrical insulator to form a space where the pads are exposed. An electrical conductor is placed in the space such that the pads are electrically connected together through the electrical conductor. The electrical conductor is in the form of a liquid or a solid having both fluidity and deformability.

18 Claims, 8 Drawing Sheets

ELECTRONIC APPARATUS WITH AN ELECTRICAL CONDUCTOR IN THE FORM OF A LIQUID AND AN ELECTRICAL INSULATOR WITH A LIGHT-CURING PROPERTY

CROSS REFERENCE TO RELATED APPLICATION

This application is based on and incorporates herein by reference Japanese Patent Application No. 2008-126931 filed on May 14, 2008.

FIELD OF THE INVENTION

The present invention relates to an electronic apparatus having a structure for preventing a break in an electrical connection and also relates to a method of making the electronic apparatus.

As disclosed, for example, in JP-A-2007-43213, a bonding wire has been used to electrically connect circuit boards. In such a conventional electrical connection structure, an electrode of one circuit board is connected through a bonding wire to an electrode of another circuit board so that the circuit boards can be electrically connected together.

Generally, after the circuit boards are electrically connected together through the bonding wire, the circuit boards are covered with a molding material such as resin or gel to protect the circuit boards and the bonding wire. Stress is applied to the bonding wire due to a difference in coefficient of thermal expansion between the molding material and the circuit boards. As a result, the bonding wire may be damaged.

SUMMARY OF THE INVENTION

In view of the above, it is an object of the present invention to provide an electrical apparatus having a structure for preventing a break in an electrical connection. It is another object of the present invention to provide a method of making the electronic apparatus.

According a first aspect of the present invention, a method of making an electronic apparatus includes preparing a package having walls for defining a first space. The method further includes placing first and second electronic devices in the first space of the package. The first and second electronic devices respectively have first and second pads. The method further includes placing a mold in the first space of the package such that the first and second pads of the first and second electronic devices are covered with the mold. The method further includes filling the first space of the package, in which the mold is placed, with an electrical insulator. The method further includes removing the mold from the electrical insulator to form a second space defined by the electrical insulator. The first and second pads are exposed to the second space. The method further includes placing an electrical conductor in the second space such that the first and second pads are electrically connected together through the electrical conductor. The electrical conductor is in the form of a liquid or a solid having both fluidity and deformability.

According a second aspect of the present invention, a method of making an electronic apparatus includes preparing a package having walls for defining a first space. The method further includes placing first and second electronic devices in the first space of the package. The first and second electronic devices respectively have first and second pads. The method further includes placing a hollow mold having a second space in the first space of the package such that the first and second pads of the first and second electronic devices are exposed to the second space of the hollow mold. The first and second spaces are separated from each other by the hollow mold. The method further includes filling the first space of the package, in which the hollow mold is placed, with an electrical insulator. The method further includes placing an electrical conductor in the second space of the hollow mold such that the first and second pads are electrically connected together through the electrical conductor. The electrical conductor is in the form of a liquid or a solid having both fluidity and deformability. The method further includes removing the hollow mold from the electrical insulator.

According a third aspect of the present invention, a method of making an electronic apparatus includes preparing a package having walls for defining a first space. The method further includes placing first and second electronic devices in the first space of the package. The first and second electronic devices respectively have first and second pads. The method further includes filling the first space of the package with an electrical insulator having a light-curing property. The method further includes placing a mask on a surface of the electrical insulator to allow the electrical insulator to have a covered portion covered with the mask and an uncovered portion that is not covered with the mask. The covered portion extends from the first pad to the second pads. The method further includes applying light to the surface of the electrical insulator to cure the uncovered portion of the electrical insulator. The method further includes removing the mask and the covered portion of the electrical insulator to form a second space defined by the cured uncovered portion of the electrical insulator. The first and second pads of the first and second electronic devices are exposed to the second space. The method further includes placing an electrical conductor in the second space such that the first and second pads are electrically connected together through the electrical conductor. The electrical conductor is in the form of a liquid or a solid having both fluidity and deformability.

According to a fourth aspect of the present invention, an electronic apparatus includes a package, first and second electronic devices, an electrical conductor, and an electrical insulator. The package has walls for defining an inner space. The first and second electronic devices are located in the inner space and respectively have first and second pads. The electrical conductor electrically connects the first and second pads. The electrical conductor is in the form of a liquid or a solid having both fluidity and deformability. The electrical insulator fills the inner space of the package to surround the electrical conductor.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
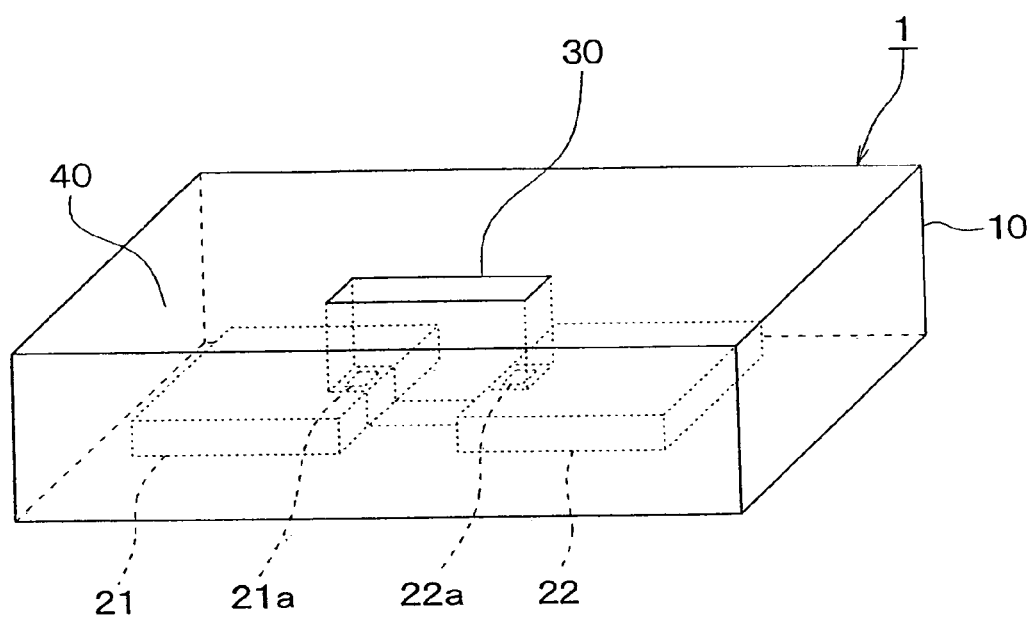
FIG. 1 is a diagram illustrating a perspective view of an electronic apparatus according to a first embodiment of the present invention.

An electronic apparatus 1 according to a first embodiment of the present invention is described below with reference to FIG. 1. As shown in FIG. 1, the electronic apparatus 1 includes a package 10, a first electronic device 21, a second electronic device 22, an electrical conductor 30, and an electrical insulator 40.

The package 10 has walls for defining an inner space and serves as a container. For example, a body case of a pressure sensor for measuring a manifold pressure can be used as the package 10. The package 10 can be made of resin, metal, ceramics, or the like.

The first and second electronic devices 21, 22 are placed in the package 10 and fixed to a bottom of the package 10 through an adhesive or the like. The first and second electronic devices 21, 22 respectively have pads 21a, 22a for electrical connection with an external device. Examples of the first and second electronic devices 21, 22 can include semiconductor chips, terminals, leads, and electrodes. In one example, the first electronic device 21 can be a semiconductor chip, and the second electronic device 22 can be a terminal. In another example, each of the first and second electronic devices 21, 22 can be a terminal. In the first embodiment, each of the first and second semiconductor chips is a semiconductor chip having a processing circuit and the like.

The electrical conductor 30 serves as an electrical wire for electrically connecting together the pads 21a, 22a of the first and second electronic devices 21, 22. The pads 21a, 22a are covered with the electrical conductor 30. Thus, the pads 21a, 22a are electrically connected together through the electrical conductor 30. In the first embodiment, the electrical conductor 30 has a rectangular solid shape with recessed portions that are in contact with the pads 21a, 21b.

The electrical conductor 30 is in the form of a liquid or a solid having both fluidity and deformability. Specifically, the electrical conductor 30 can be liquid metal such as mercury, lead-bismuth alloy, lithium, lead paste, or the like. Mercury has the melting point of minus 38.83° C. and is in the form of a liquid at room temperature. Lead-bismuth alloy has the melting point of 125° C. and is in the form of a solid at room temperature. Lithium has the melting point of 180.49° C. and is in the form of a solid at room temperature. Gallium has the melting point of 29.76° C. and is in the form a liquid or a solid at room temperature. In the first embodiment, the electrical conductor 30 is mercury.

The electrical insulator 40 fills a clearance between the electrical conductor 30 and the walls of the package 10. That is, the inner space of the package 10 is filled with the electrical insulator 40 so that the electrical conductor 30 is surrounded by the electrical insulator 40. In this way, while the first and second electronic devices 21, 22 are covered and protected by the electrical insulator 40, the electrical conductor 30 is fixed in the package 10 by the electrical insulator 40.

For example, the electrical insulator 40 can be gel, resist, epoxy resin, silicon rubber, or the like. In the first embodiment, the electrical insulator 40 is gel.

The electrical conductor 30 and the electrical insulator 40 have different specific gravities. In the first embodiment, the electrical conductor 30 has a specific gravity greater than a specific gravity of the electrical insulator 40. In such an approach, it is possible to prevent the electrical insulator 40 from pressing and crushing the electrical conductor 30.

A method of making the electronic apparatus 1 shown in FIG. 1 is described below with reference to FIGS. 2A-3B.

Figure 2A:
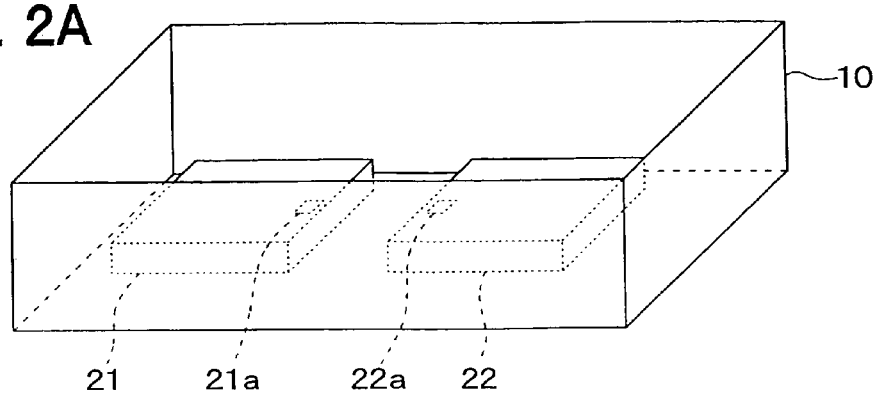
FIGS. 2A-2C are diagrams illustrating a method of making the electronic apparatus of FIG. 1.

Firstly, in a process shown in FIG. 2A, the package 10 and the first and second electronic devices 21, 22 are prepared. The pads 21a, 22a are preformed on outer regions of the first and second electronic devices 21, 22, respectively. The first and second electronic devices 21, 22 are placed in the package 10 and fixed to the bottom of the package 10 using an adhesive or the like. Specifically, a side on which the pad 21a is formed is positioned opposite to a side on which the pad 22a is formed, so that the pads 21a, 22a can be arranged in a line.

Figure 2B:
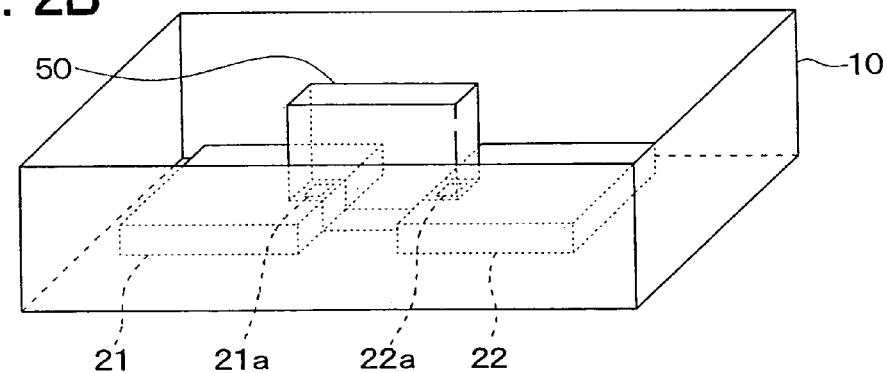

Next, in a process shown in FIG. 2B, a mold 50 is prepared and placed in the package 10 to cover the pads 21a, 22a of the first and second electronic devices 21, 22.

In the first embodiment, the mold 50 has the same shape as the electrical conductor 30 except for the height. The height of the mold 50 is greater than the height to which the electrical insulator 40 is poured into the package 10. In such an approach, it is possible to pull out the mold 50 from the electrical insulator 40 after the electrical insulator 40 is poured into the package 10.

The mold 50 can be made of various materials, as long as the mold 50 can cover the pads 21a, 22a. It is preferable that the mold 50 be made of a material having a high resistance to corrosion. For example, the mold 50 can be made of ice, wood, metal, or the like.

Figure 2C:
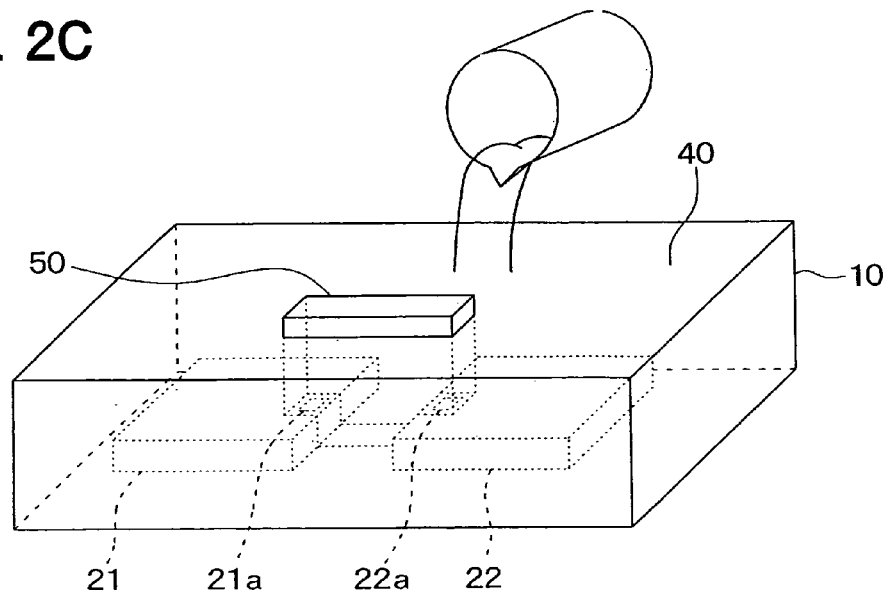

Then, in a process shown in FIG. 2C, the electrical insulator 40 is poured into the package 10 in which the mold 50 is placed, until the package 10 is filled with the electrical insulator 40. Then, the electrical insulator 40 is cured (i.e., hardened). In the first embodiment, gel is poured into the package 10 and then cured.

Figure 3A:
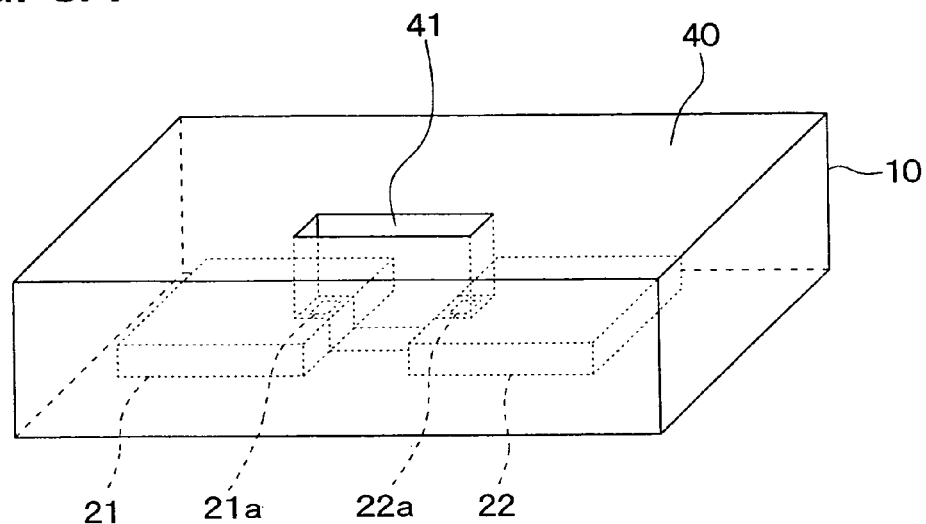
FIGS. 3A and 3B are diagrams illustrating the method of making the electronic apparatus of FIG. 1 following FIGS. 2A-2C.

Next, in a process shown in FIG. 3A, the mold 50 is removed from the cured electrical insulator 40 to form a space 41 defined by the electrical insulator 40. As described previously, the pads 21a, 22a of the first and second electronic devices 21, 22 are covered with the mold 50, when the electrical insulator 40 is poured into the package 10. Therefore, the pads 21a, 22a are exposed to the space 41 that is formed by removing the mold 50 from the electrical insulator 40. The space 41 has the same shape as the electrical conductor 30.

Figure 3B:
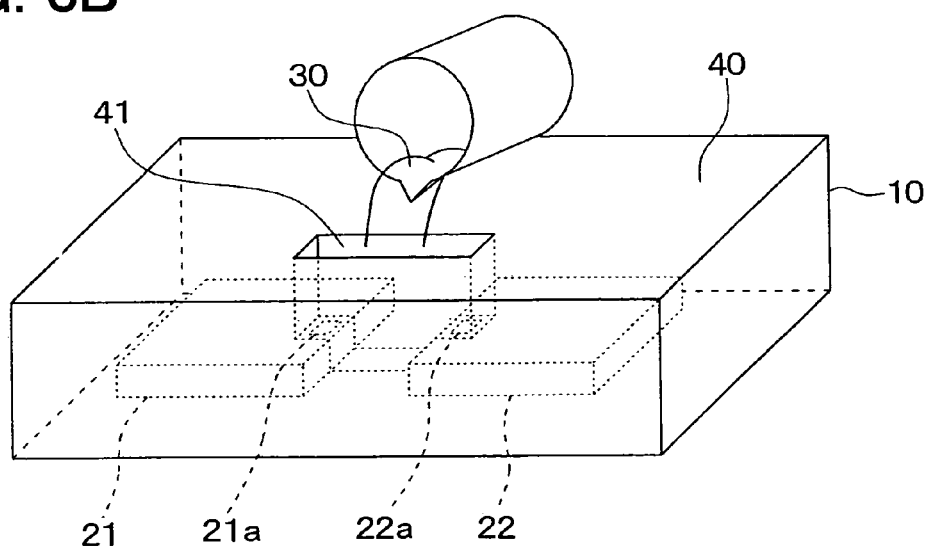

Next, in a process shown in FIG. 3B, the electrical conductor 30 is poured into the space 41 defined by the electrical insulator 40. In the first embodiment, mercury is poured into the space 41. Thus, the electrical conductor 30 is in contact with each of the pads 21a, 22a of the first and second electronic devices 21, 22 so that the first and second electronic devices 21, 22 can be electrically connected together through the electrical conductor 30. In this way, the electronic apparatus 1 shown in FIG. 1 is completed. In addition, the package 10 can be sealed with a lid (not shown).

In the electronic apparatus 1 made in the above method, a break in an electrical connection between the pads 21a, 22a is less likely to occur for the following reasons. The first and second electronic devices 21, 22 are electrically connected together though the electrical conductor 30, i.e., mercury. Mercury has both fluidity and deformability and thus can be flexibly deformed under stress. That is, even when mercury in the space 41 is deformed, mercury is kept in contact with each of the pads 21a, 22a. Accordingly, the electrical connection between the pads 21a, 22a can be kept.

When viewed at a micro level, mercury consists of a lot of metal atoms, each of which provides electric conduction. Here, it is assumed that three metal atoms are aligned to form an electric path. If one metal atom located in the middle of the three metal atoms moves, the electrical path is disconnected. However, since mercury has both fluidity and deformability, another metal atom moves in the middle so that the electrical path can be restored at once. Therefore, the use of mercury makes it less like that a break in the electrical connection between the first and second electronic devices 21, 22 occurs.

There may be a possibility that mercury in the space 41 is split into two portions due to fluidity and deformability. Even when mercury is split into two potions, the split two portions come into contact with each other again. In this way, the electrical path between the pads 21a, 22a is restored immediately after mercury is split into two potions. Therefore, the use of mercury makes it less likely that a break in the electrical connection between the first and second electronic devices 21, 22 occurs.

As described above, according to the first embodiment, the electronic devices 21, 22 are electrically connected together through the electrical conductor 30 that is in the form of a liquid or a solid having both fluidity and deformability.

In such an approach, even when the electrical conductor 30 is deformed, the electrical connection between the electronic devices 21, 22 can be ensured. Further, even when the electrical conductor 30 is split into multiple portions, the split portions are spontaneously joined together again so that the electrical connection between the electronic devices 21, 22 can be restored at once. Thus, the use of the electrical conductor 30 in the form of a liquid or a solid having both fluidity and deformability allows the electronic apparatus 1 to have high reliability against failure.

In contrast, in a conventional electrical connection using a bonding wire, once the bonding wire is split into portions, the split portions of the broken wire cannot be spontaneously joined together.

Further, according to the first embodiment, the first and second electronic devices 21, 22 are placed in the electrical insulator 40. By using a soft material for the electrical insulator 40, vibrations transmitted between the first and second electronic devices 21, 22 can be reduced.

Second Embodiment

A second embodiment of the present invention is described below with reference to FIGS. 4A and 4B. A difference between the first and second embodiments is as follows. In the first embodiment, the space 41 defined by the electrical insulator 40 is wholly filled with the electrical conductor 30. In the second embodiment, the space 41 is partially filled with the electrical conductor 30.

Figure 4A:
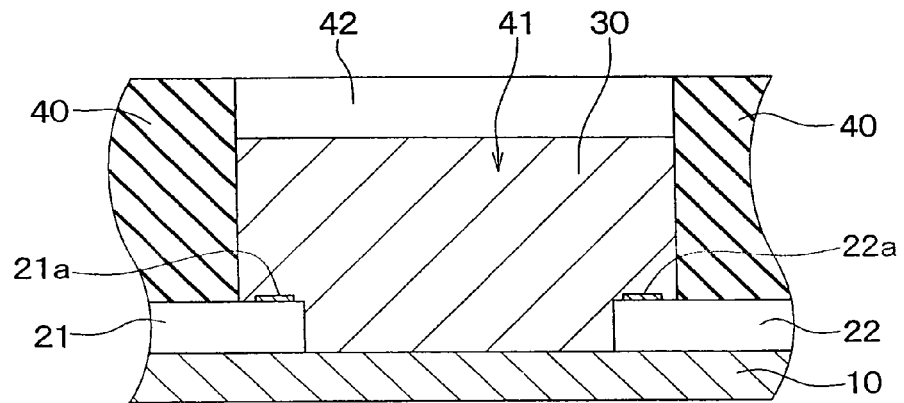
FIGS. 4A and 4B are diagrams illustrating a method of making an electronic apparatus according to a second embodiment of the present invention.

In a process shown in FIG. 4A corresponding to FIG. 3B, the electrical conductor 30 is poured into the space 41 until the electrical conductor 30 is in contact with each of the pads 21a, 22a of the electronic devices 21, 22. Thus, the first and second electronic devices 21, 22 are electrically connected together through the electrical conductor 30. Unlike the first embodiment, the space 41 is not wholly filled with the electrical conductor 30 so that a space 42 as a portion of the space 41 can be left above the electrical conductor 30.

Figure 4B:
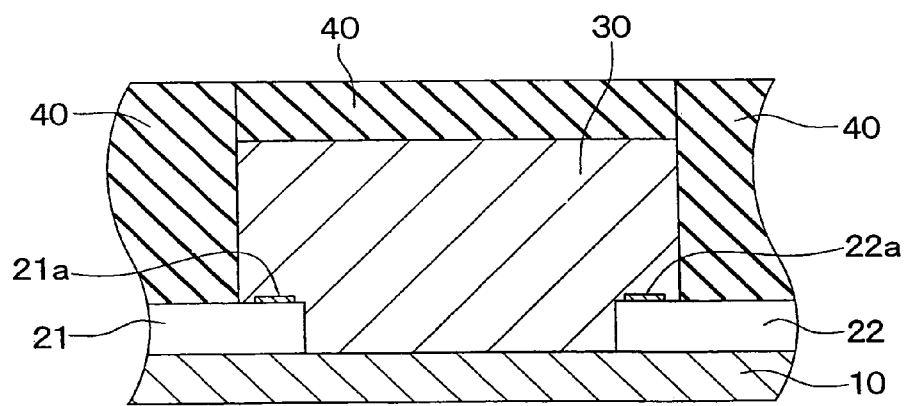

Then, in a process shown in FIG. 4B, the electrical insulator 40 is poured on the electrical conductor 30, at least until the electrical conductor 30 is covered with electrical insulator 40. In the second embodiment, the electrical insulator 40 is poured on the electrical conductor 30, until the space 42 is wholly filled with the electrical insulator 40. Thus, the electrical conductor 30 is surrounded by the electrical insulator 40.

As described above according to the second embodiment, the electrical conductor 30 is surrounded by the electrical insulator 40. In such an approach, even when the electronic apparatus 1 changes its posture, deformation of the electrical conductor 30 can be prevented. Accordingly, overflow of the electrical conductor 30 from the space 41 can be prevented. Further, intrusion of foreign matters into the electrical conductor 30 can be prevented.

Third Embodiment

Figure 5:
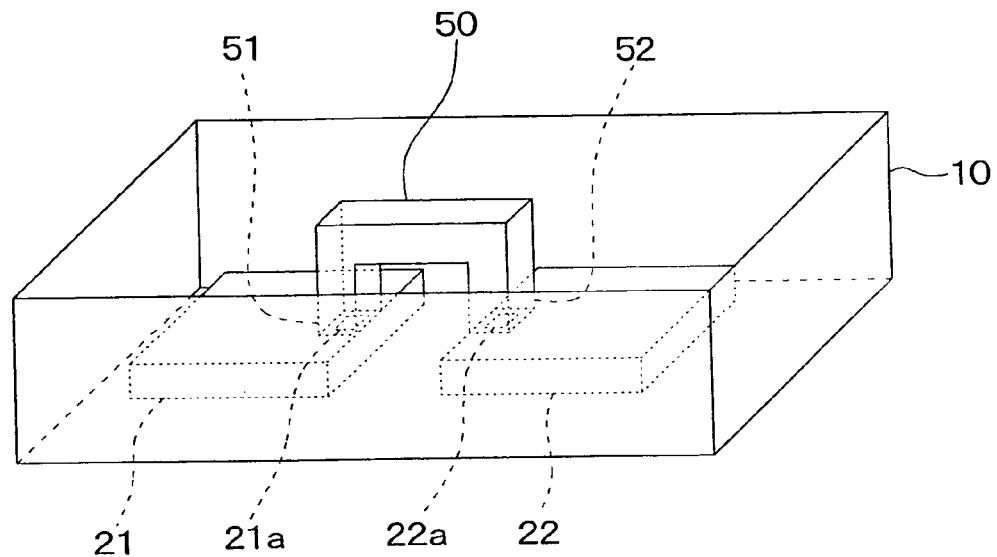
FIG. 5 is a diagram illustrating a method of making an electronic apparatus according to a third embodiment of the present invention.

A third embodiment of the present invention is described below with reference to FIG. 5. A difference between the first and third embodiments is as follows.

In the third embodiment, a substantially U-shaped mold 50 having first and second ends 51, 52 is prepared. Then, in a process shown in FIG. 5 corresponding to FIG. 2B, the U-shaped mold 50 is placed in the package 10 such that the pad 21a of the electronic device 21 is covered with the first end 51 and such that the pad 22a of the electronic device 22 is covered with the second end 52.

Then, in the process shown in FIG. 2C, the electrical insulator 40 is poured into the package 10 so that the package 10 can be filled with the electrical insulator 40. Then, in the process shown in FIG. 3A, the U-shaped mold 50 is removed from the electrical insulator 40 to form a substantially U-shaped space 41 where the pads 21a, 22a of the first and second electronic devices 21, 22 are exposed. In other words, the space 41 is shaped like a bridge extending from the pad 21a to the pad 22a.

Then, in the process shown in FIG. 3B, the electrical conductor 30 is poured into the space 41 so that the electrical conductor 30 can be in contact with each of the pads 21a, 22a. In this way, an electronic apparatus 1 of the third embodiment is completed. When a liquid material such as mercury is used as the electrical conductor 30, it is preferable to perform a defoaming treatment to prevent air from remaining in the electrical conductor 30.

As described above, according to the third embodiment, the pads 21a, 22a are locally covered with the U-shaped mold 50. In such an approach, the electrical conductor 30 can have a shape like a wire. The electrical conductor 30 has a specific gravity greater than a specific gravity of the electrical insulator 40. Therefore, even when the electrical conductor 30 has a shape like a wire, it is possible to prevent the electrical insulator 40 from crushing the electrical conductor 30.

Fourth Embodiment

Figure 6:
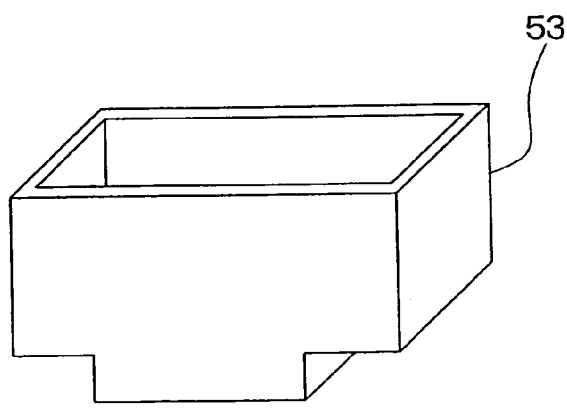
FIG. 6 is a diagram illustrating a perspective view of a mold used to make an electronic apparatus according to a fourth embodiment of the present invention.

A fourth embodiment of the present invention is described below with reference to FIG. 6. A difference between the first and fourth embodiments is as follows.

In the fourth embodiment, the electronic apparatus 1 is made by using a hollow mold 53 instead of the mold 50. A difference between the mold 50 and the hollow mold 53 is in that the hollow mold 50 is opened at top and bottom sides. The top and bottom sides of the hollow mold 53 communicate with each other through an inner space of the hollow mold 53. Thus, the hollow mold 53 is shaped like a tube. The electronic apparatus 1 is made as follows using the hollow mold 53.

In the process shown in FIG. 2B, the hollow mold 53 is placed in the package 10 such that the bottom side of the hollow mold 53 is in contact with the electronic devices 21, 22 and the bottom of the package 10. Thus, the pads 21a, 22a of the electronic devices 21, 22 are exposed to the inner space of the hollow mold 53. The inner space of the hollow mold 53 is separated from the inner space of the package 10 between the walls of the package 10 and walls of the hollow mold 53. It is noted that the top side of the hollow mold 53 is located at a height greater than a height to which the electrical insulator 40 is poured into the package 10.

Then, the electrical insulator 40 is poured into the inner space of the package 10 between the walls of the package 10 and the walls of the hollow mold 53, and the electrical conductor 30 is poured into the inner space of the hollow mold 53. Thus, the electrical conductor 30 is in contact with each of the pads 21a, 22a of the electronic devices 21, 22 so that the electronic devices 21, 22 can be electrically connected together through the electrical conductor 30.

After the electrical insulator 40 is cured, the hollow mold 53 is removed from the electrical insulator 40. There may be a possibility that a clearance having a width corresponding to a thickness of the wall of the hollow mold 53 is formed between the electrical conductor 30 and the electrical insulator 40 after the hollow mold 53 is removed from the electrical insulator 40. The electrical insulator 40 can fill the clearance spontaneously.

In the first embodiment, the electrical conductor 30 is poured into, the space 41, after the mold 50 is removed from the electrical insulator 40 to form the space 41. The electrical insulator 40 may be deformed and fill the space 41, after the mold 50 is removed from the electrical insulator 40. In such a case, the electrical conductor 30 cannot be poured into the space 41.

As described above, according to the fourth embodiment, the hollow mold 53 is used instead of the mold 50. The inner space of the hollow mold 53 is separated from the inner space of the package 10. Thus, the inner space into which the electrical conductor 30 is poured can be ensured. Therefore, for example, the electrical conductor 30 can be poured into the hollow mold 53, before the electrical insulator 40 is poured into the package 10.

Fifth Embodiment

A fifth embodiment of the present invention is described below. A difference between the fourth and fifth embodiments is as follows. In the fifth embodiment, the electrical conductor 30 is poured into the inner space of the hollow mold 53 to a height less than a height to which the electrical insulator 40 is poured into the inner space between the walls of the package 10 and the walls of the hollow mold 53. That is, the inner space of the hollow mold 53 is not wholly filled with the electrical conductor 30 so that a space, can be left above the electrical conductor 30 in the hollow mold 53. Then, the electrical insulator 40 is poured on the electrical conductor 30 in the hollow mold 53 so that the electrical conductor 30 can be covered with the electrical insulator 40.

After the electrical insulator 40 is cured, the hollow mold 53 is removed from the electrical insulator 40. As described previously, although a clearance formed between the electrical conductor 30 and the electrical insulator 40 at a time the hollow mold 53 is removed from the electrical insulator 40, the electrical insulator 40 can fill the clearance spontaneously. As a result, the electrical conductor 30 is surrounded by the electrical insulator 40. Therefore, like the second embodiment, deformation of the electrical conductor 30 can be prevented, and intrusion of foreign matters into the electrical conductor 30 can be prevented.

Sixth Embodiment

A sixth embodiment of the present invention is described below. A difference between the fourth and sixth embodiments is as follows. In the sixth embodiment, a substantially U-shaped hollow mold 53 is used. The U-shaped hollow mold 53 defines an inner space and has first and second open ends. In the U-shaped hollow mold 53, the first and second open ends communicate with each other through the inner space. The U-shaped hollow mold 53 is provided by making the U-shaped mold 50 shown in FIG. 5 hollow such that the first and second ends 51, 52 are opened and such that the first and second ends 51, 52 communicate with each other.

The U-shaped hollow mold 53 is placed in the package 10 such that the first open end, is located on the pad 21a of the electronic device 21 and such that the second open end is located on the pad 22a of the electronic device 22. Thus, the pads 21a, 22a are exposed to the inner space of the U-shaped hollow mold 53. Then, like the fourth embodiment, the electrical conductor 30 is poured into the inner space of the U-shaped hollow mold 53, and the electrical insulator 40 is poured into the inner space of the package 10 between the walls of the package 10 and walls of the U-shaped hollow mold 53.

Like the fifth embodiment, the electrical conductor 30 can be poured into the inner space of the U-shaped hollow mold 53 to a height less than a height to which the electrical insulator 40 is poured into the inner space of the package 10 between the walls of the package 10 and the walls of the hollow mold 53. In this case, the electrical insulator 40 is poured on the electrical conductor 30 in the U-shaped hollow mold 53 so that the electrical conductor 30 can be surrounded by the electrical insulator 40.

As described above, according to the sixth embodiment, the U-shaped hollow mold 53 is used. In such an approach, the inner space into which the electrical conductor 30 is poured can be ensured. Further, the electrical conductor 30 can have a shape like a wire.

Seventh Embodiment

A seventh embodiment of the present invention is described below. A difference between the preceding embodiments and the seventh embodiment is as follows. In the preceding embodiments, there is a need to pull out the molds 50, 53 from the electrical insulator 40. Specifically, in the first, second, and third embodiments, the electrical conductor 30 is poured into the space 41 that is formed by pulling out the molds 50 from the electrical insulator 40. In the fourth, fifth, and sixth embodiments, the molds 53 are pulled out from the electrical insulator 40 after the electrical conductor 30 is poured into the inner space of the molds 53.

In the seventh embodiment, the molds 50, 53 are made of a sublimation material, which can change from solid to gas. For example, the molds 50, 53 can be made of fluorine resin. The molds 50, 53 are removed from the electrical insulator 40 by causing the molds 50, 53 to sublime.

As described above, according to the seventh embodiment, the molds 50, 53 are made of a sublimation material such as fluorine resin. In such an approach, the molds 50, 53 can be removed from the electrical insulator 40 without pulling out the molds 50, 53 from the electrical insulator 40. Accordingly, manufacturing process of the electronic apparatus 1 can be simplified.

Eighth Embodiment

An eighth embodiment of the present invention is described below with reference to FIGS. 7A-7C. A difference between the preceding embodiments and the eighth embodiment is as follows. In the preceding embodiments, the space into which the electrical conductor 30 is poured is formed in the electrical insulator 40 by using the molds 50, 53. In the eighth embodiment, the space into which the electrical conductor 30 is poured is formed in the electrical insulator 40 without using the molds 50, 53. Specifically, in the eighth embodiment, the electrical insulator 40 has a light-curing property. A method of making an electronic apparatus 1 using the light-curing electrical insulator 40 is described below.

Firstly, in the process shown in FIG. 2A, the first and second electronic devices 21, 22 are placed in the package 10. Then, the light-curing electrical insulator 40 is poured into the package 10 in which no mold is placed.

Figure 7A:
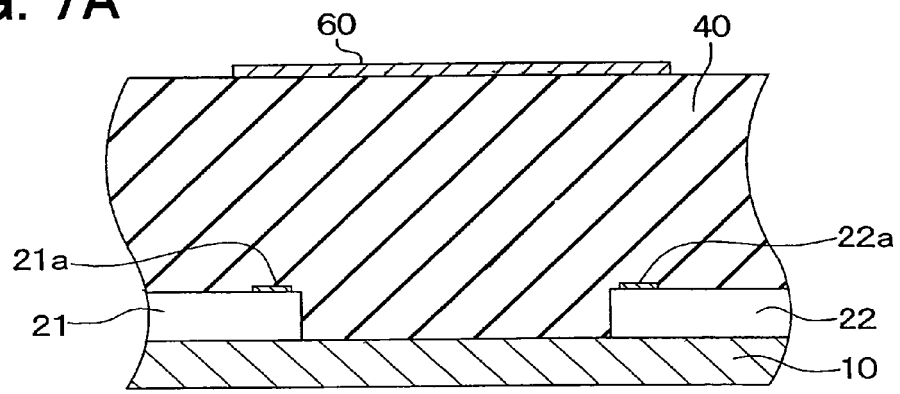
FIGS. 7A-7C are diagrams illustrating a method of making an electronic apparatus according to an eighth embodiment of the present invention.

Then, in a process shown in FIG. 7A, a mask 60 is formed on a surface of the light-curing electrical insulator 40. When viewed from the surface of the light-curing electrical insulator 40, the mask 60 covers the pads 21a, 22a of the first end second electronic devices 21, 22 and extends from the pad 21a to the pad 22a. Thus, when viewed from the surface of the light-curing electrical insulator 40, the light-curing electrical insulator 40 has a covered portion covered with the mask 60 and an uncovered portion that is not covered with the mask 60. For example, the mask 60 can be made of a resist, a plate, or the like.

Figure 7B:
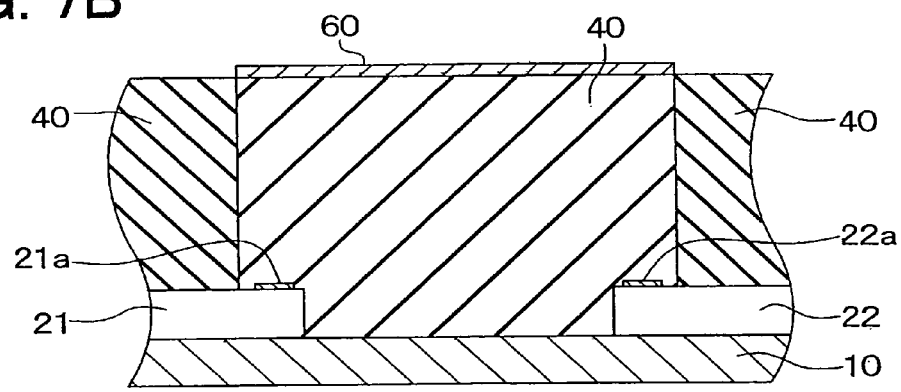

Next, in a process shown in FIG. 7B, light is applied to the surface of the light-curing electrical insulator 40. As a result, although the covered portion of the light-curing electrical insulator 40 is not cured, the uncovered portion of the light-curing electrical insulator 40 is cured.

Figure 7C:
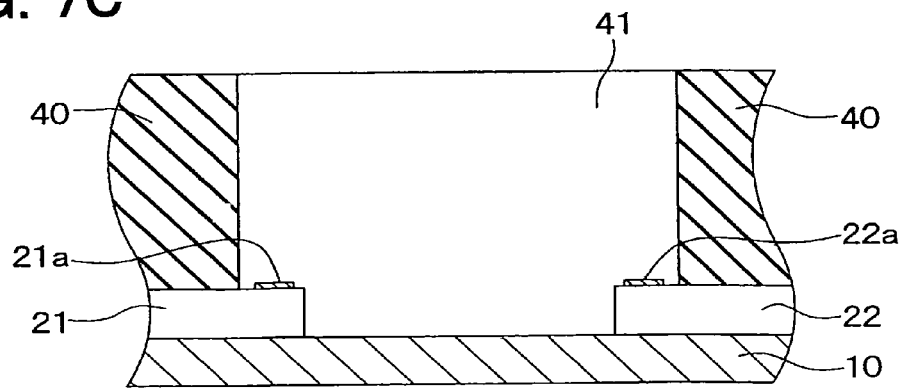

Then, in a process shown in FIG. 7C, the mask 60 and the covered portion of the light-curing electrical insulator 40 are removed. As a result, a space 41 where the pads 21a, 22a are exposed is defined by the uncovered portion (i.e., cured portion) of the light-curing electrical insulator 40. In this way, the structure shown in FIG. 3A can be achieved using the light-curing electrical insulator 40.

Then, in the process shown in FIG. 3B, the electrical conductor 30 is poured into the space 41 so that the pads 21a, 22a can be electrically connected together through the electrical conductor 30. In this way, the electronic apparatus 1 can be made without using the molds 50, 53.

As described above, according to the eighth embodiment, the electronic apparatus 1 is made using the light-curing electrical insulator 40. In such an approach, there is no need to use the molds 50, 53. Accordingly, a process (e.g., shown in FIG. 2B) for placing the molds 50, 53 in the package 10 and a process (e.g., shown in FIG. 3A) for removing the molds 50, 53 from the electrical insulator 40 can be omitted.

Ninth Embodiment

Figure 8:
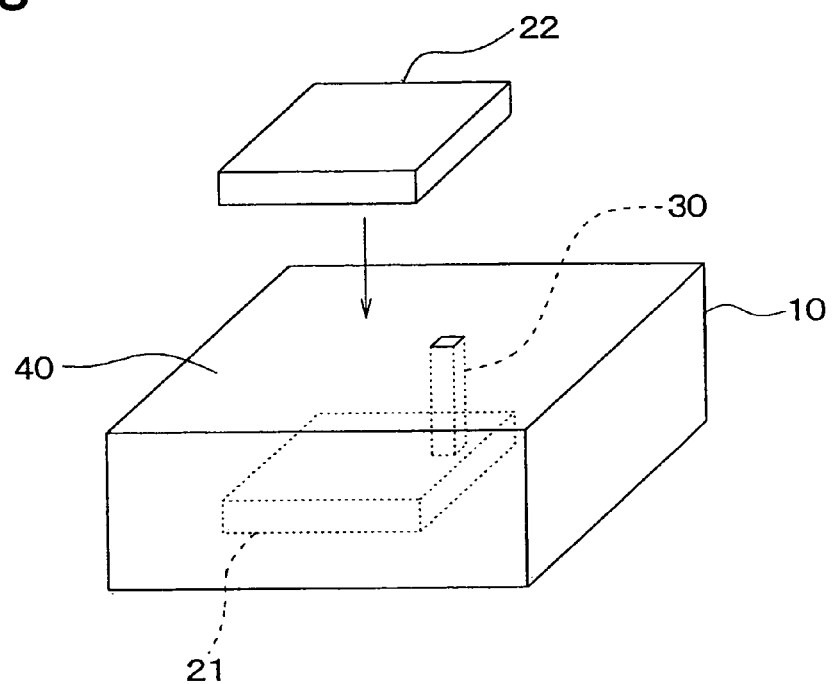
FIG. 8 is a diagram illustrating a method of making an electronic apparatus according to a ninth embodiment of the present invention.

An ninth embodiment of the present invention is described below with reference to FIG. 8. A difference between the preceding embodiments and the ninth embodiment is as follows. In the ninth embodiment, while the first electronic device 21 is placed in the package 10, the second electronic device 22 is mounted by flip chip bonding. An electronic apparatus 1 according to the ninth embodiment is made as follows.

Firstly, in the process shown in FIG. 2A, only the first electronic device 21 is placed in the package 10. Then, in the process shown in FIG. 2B, the mold 50 is placed in the package 10 such that the pad 21a of the first electronic device 21 is covered with the mold 50. Then, in the process shown in FIG. 2C, the electrical insulator 40 is poured into the package 10. Then, in the process shown in FIG. 3A, the mold 50 is pulled out from the electrical insulator 40 to form the space 41 where the pad 21a of the first electronic device 21 is exposed. Then, in the process shown in FIG. 3B, the electrical conductor 30 is poured into the space 41 so that the electrical conductor 30 can be in contact with the pad 21a and exposed to a surface of the electrical insulator 40.

Then, the second electronic device 22 is prepared, and a bump (not shown) is formed on the pad 22a of the second electronic device 22. Then, in a process shown in FIG. 8, the second electronic device 22 is positioned so that the pad 22a of the second electronic device 22 can face an exposed portion of the electrical conductor 30. Then, the second electronic device 22 is placed on the electrical insulator 40 so that the bump on the pad 22a can be joined to the exposed portion of the electrical conductor 30. In this way, the second electronic device 22 is flip-chip mounted, and the electronic apparatus 1 is completed.

As described above, according to the ninth embodiment, the first electronic device 21 is placed in the package 10, and the second electronic device 22 is flip-chip mounted. In such an approach, the first and second electronic devices 21, 22 can be stacked to reduce the length of the electrical conductor 30. Accordingly, the size of the electronic apparatus 1 can be reduced. For example, the second electronic device 22 can be a gyroscope.

In the ninth embodiment, the space 41 can be formed by the mold 50 made of a sublimation material of the mask 60.

Tenth Embodiment

A tenth embodiment of the present invention is described below with reference to FIG. 9. A difference between the preceding embodiments and the tenth embodiment is as follows. In the preceding embodiments, the electrical insulator 40 in the package 10 has a single layer structure. In the tenth embodiment, the electrical insulator 40 in the package 10 has a multilayer structure.

Figure 9:
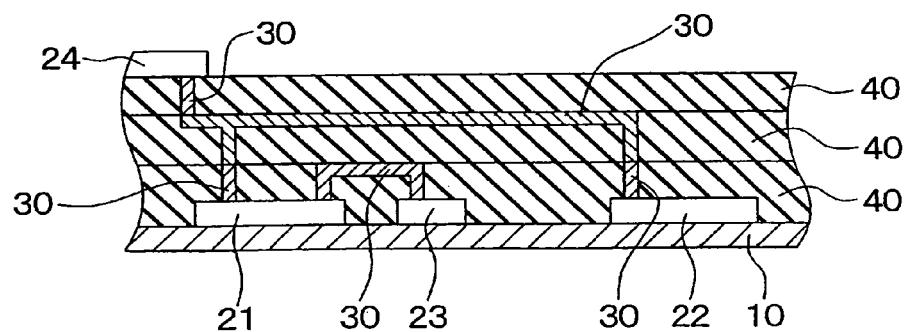
FIG. 9 is a diagram illustrating a cross-sectional view of an electronic apparatus according to a tenth embodiment of the present invention.

As shown in FIG. 9, first, second, and third electronic devices 21-23 are placed in the package 10. The electrical insulator 40 has three layers. The first, second, and third electronic devices 21-23 are located in the bottom layer of the electrical insulator 40. The first and third electronic devices 21, 23 are electrically connected together through a bridge-shaped electrical conductor 30. A first straight-shaped electrical conductor 30 is electrically connected to the first electronic device 21, and a second straight-shaped electrical conductor 30 is electrically connected to the second electronic device 22.

In the middle layer of the electrical insulator 40, the first and second straight-shaped electrical conductors 30 are connected together through a third straight-shaped electrical conductor 30. A fourth straight-shaped electrical conductor 30 located in the top layer of the electrical insulator 40 is electrically connected to the third straight-shaped electrical conductor 30 at one end and exposed to a surface of the electrical insulator 40 at the other end. A fourth electronic device 24 is flip-chip mounted on the exposed end of the fourth straight-shaped electrical conductor 30.

As described above, according to the tenth embodiment, the electrical insulator 40 has a multilayer structure. In such an approach, the electrical conductors 30 can be arranged in the package 10 in a multilayer manner so that multiple electronic devices 21-24 can be electrically connected together in the package 10. Accordingly, the electrical conductors 30 can be arranged at high density and also intersect with each other through layers of the electrical insulator 40.

Examples of the first through fourth electronic devices 21-24 can include semiconductor chips and terminals. In one example, some of the electronic devices 21-24 can be semiconductor chips, and the others of the electronic devices 21-24 can be terminals. In another example, all the electronic devices 21-24 can be terminals.

Eleventh Embodiment

An eleventh embodiment of the present invention is described below with reference to FIG. 10. A difference between the first and the eleventh embodiments is as follows. In the eleventh embodiment, at least three electronic devices are placed in the package 10.

Figure 10:
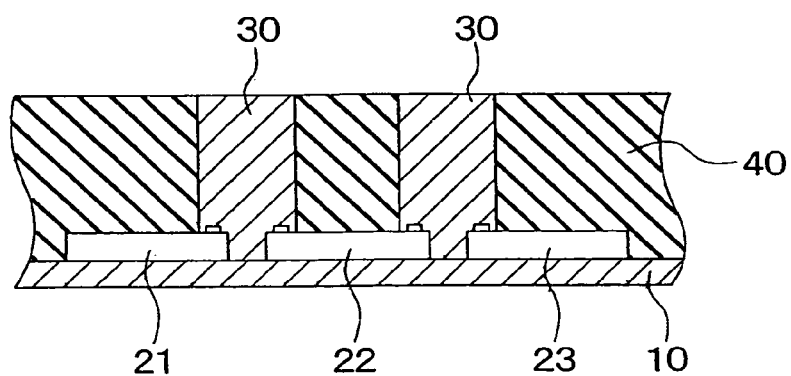
FIG. 10 is a diagram illustrating a cross-sectional view of an electronic apparatus according to an eleventh embodiment of the present invention.

For example, as shown in FIG. 10, first, second, and third electronic devices 21-23 are placed in the package 10. Each of the first, second, and third electronic devices 21-23 is a semiconductor chip.

The first and second electronic devices 21, 22 are electrically connected together through a first electrical conductor 30, and the second and third electronic devices 22, 23 are electrically connected together through a second electrical conductor 30. Each of the first and second electrical conductors 30 is surrounded by the electrical insulator 40.

As described above, according to the eleventh embodiment, multiple semiconductor chips 21-23 are placed in the package 10.

Twelfth Embodiment

A twelfth embodiment of the present invention is described below with reference to FIG. 11. A difference between the eleventh and the twelfth embodiments is as follows. In the twelfth embodiment, an inclined portion 11 is formed on the bottom of the package 10. The third electronic device 23 is placed on the inclined portion 11.

Figure 11:
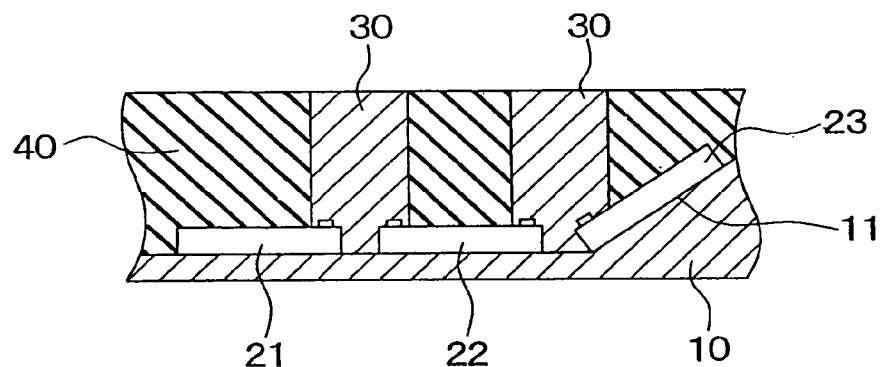
FIG. 11 is a diagram illustrating a cross-sectional view of an electronic apparatus according to a twelfth embodiment of the present invention.

In FIG. 11, only the third electronic device 23 is placed on the inclined portion 11. In addition to or instead of the third electronic device 23, the first electronic device 21 can be placed on the inclined portion 11. The inclined portion 11 can be a single piece with the package 10 or a separate piece of the package 10.

As described above, according to the twelfth embodiment, the third electronic device 23 is placed on the inclined portion 11 of the package 10. In such an approach, the package 10 can be reduced in size.

Thirteenth Embodiment

Figure 12:
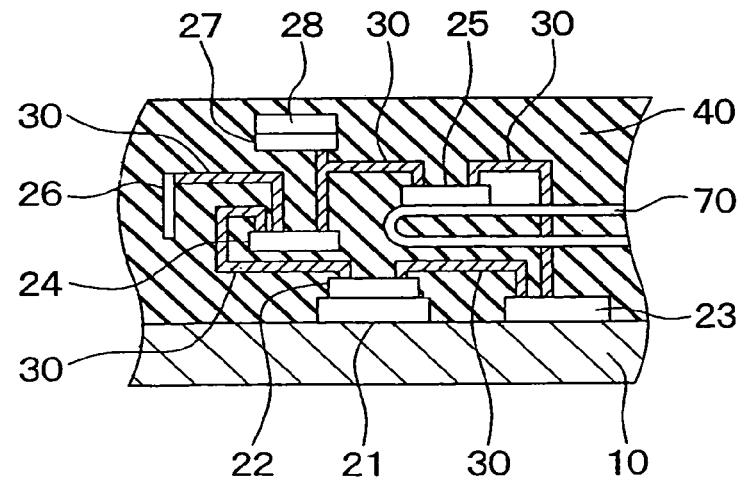
FIG. 12 is a diagram illustrating a cross-sectional view of an electronic apparatus according to a thirteenth embodiment of the present invention.

A thirteenth embodiment of the present invention is described below with reference to FIG. 12. A difference between the preceding embodiments and the thirteenth embodiment is as follows. In the thirteenth embodiment, as shown in FIG. 12, first through eighth electronic devices 21-28 are placed in the package 10.

The first electronic device 21 is a terminal and fixed to the bottom of the package 10. The second electronic device 22 is a semiconductor chip and mounted on the first electronic device 21. The third electronic device 23 is fixed to the bottom of the package 10.

The fourth and fifth electronic devices 24, 25 are placed in a middle layer of the electrical insulator 40. Further, a pipe 70 is placed in the middle layer of the electrical insulator 40 to cool the electronic device 25. A cooling fluid such as water or air flows through the pipe 70.

The sixth electronic device 26 is placed in the middle layer of the electrical insulator 40 such that the sixth electronic device 26 is perpendicular to the bottom of the package 10. Each of the third through sixth electronic devices 23-26 is a semiconductor chip. In this way, the sixth electronic device 26 can be vertically placed according to the intended use of the electronic apparatus 1.

The seventh electronic device 27 is a semiconductor chip and placed in a top layer of the electrical insulator 40. A front surface of the seventh electronic device 27 faces the bottom of the package 10. The eighth electronic device 28 is a terminal and joined to a back surface of the seventh electronic device 27.

Electrical conductors 30 electrically connects the second and third electronic devices 22, 23, the second and fourth electronic devices 22, 24, the third and fifth electronic devices 23, 25, the fourth and fifth electronic devices 24, 25, the fourth and fifth electronic devices 24, 25, the fourth and sixth electronic devices 24, 26, the fourth and seventh electronic devices 24, 27, and the fifth and seventh electronic devices 25, 27, respectively.

The electronic devices 21-28 and the electrical conductors 30 are covered with the electrical insulator 40. It is preferable that the electrical insulator 40 be made of hard resin such as epoxy resin to support the electronic devices 21-28 and the electrical conductors 30 in place.

As described above, according to the thirteenth embodiment, the electrical insulator 40 has a multilayer structure. In such an approach, various devices such as the electronic devices 21-28 and the pipe 70 can be placed in the electrical insulator 40.

(Modifications)

The embodiments described above can be modified in various ways. For example, three or more electronic devices can be placed in the package 10 and electrically connected together through conductors 30, respectively.

The pads 21a, 22a can be arranged not to be in a straight line. In such a case, a curved electrical conductor 30 is used to electrically connect the pads 21a, 22a.

The electrical conductor 30 can be a material other than a liquid metal. For example, the electrical conductor 30 can be an electrically conductive resin made by adding vapor of iodine to polyacetylene, an electrically conductive liquid, rubber, or gel containing an electrically conductive filler, an electrically conductive fine powder, a carbon nanotube, or the like.

In the second embodiment, the electrical insulator 40 is surrounded by the electrical conductor 30 in the process shown in FIG. 4B. Alternatively, the process shown in FIG.

4B can be omitted not to fill the space 42. In such a case, a lid can be attached to the package 10 to seal the space 42 so that air in the space 42 can keep the electrical conductor 30 in the space 41. Even if a portion of the conductor 30 moves from the space 42 to the space 41 due to the posture of the electronic apparatus 1, the conductor 30 can be generally kept in contact with each of the pads 21a, 22a. It may be a possibility that the electrical conductor 30 is disconnected from the pads 21a, 22a due to the movement of the electrical conductor 30, if the amount of the electrical conductor 30 poured in the space 41 is small. However, the electrical conductor 30 can be connected to the pads 21a, 22a again, when the electronic apparatus 1 returns to original posture.

Such changes and modifications are to be understood as being within the scope of the present invention as defined by the appended claims.

What is claimed is:

1. An electronic apparatus comprising:
    a package having walls for defining an inner space;
    first and second electronic devices located in the inner space and respectively having first and second pads;
    an electrical conductor that electrically connects the first and second pads, the electrical conductor being in the form of a liquid; and
    an electrical insulator that fills the inner space of the package to surround the electrical conductor, the electrical insulator having a light-curing property.

2. The electronic apparatus according to claim 1, wherein the electrical insulator is gel.

3. The electronic apparatus according to claim 1, wherein the electrical conductor is mercury.

4. The electronic apparatus according to claim 1, wherein the electrical conductor is lead-bismuth alloy.

5. The electronic apparatus according to claim 1, wherein the electrical conductor is lithium.

6. The electronic apparatus according to claim 1, wherein the electrical conductor is gallium.

7. The electronic apparatus according to claim 1, wherein the electrical insulator completely fills a clearance between the electrical conductor and the walls of the package.

8. The electronic apparatus according to claim 1, wherein the electrical conductor is formed by being poured within a space defined by the electrical insulator.

9. The electronic apparatus according to claim 1, wherein the electrical conductor electrically connects directly to the first and second pad.

10. The electronic apparatus according to claim 1, wherein the electrical conductor has a rectangular shape with recessed portions that are in contact with the first and second pads.

11. The electronic apparatus according to claim 1, wherein the electrical insulator completely fills a clearance between the electrical conductor and the walls of the package, and the electrical insulator is disposed so as to sandwich the electrical conductor between the first and second pads.

12. The electronic apparatus according to claim 1, wherein the electrical conductor is U-shaped with first and second ends that are in direct electrical contact with the first and second pads.

13. An electronic apparatus comprising:
    a package having walls for defining an inner space;
    first and second electronic devices located in the inner space and respectively having first and second pads;
    an electrical conductor that electrically connects the first and second pads, the electrical conductor being in the form of a liquid; and
    an electrical insulator that fills the inner space of the package to surround the electrical conductor, the electrical insulator having a light-curing property, wherein
    the electrical insulator completely fills a clearance between the electrical conductor and the walls of the package,
    the electrical conductor is formed by being poured within a space defined by the electrical insulator.

14. The electronic apparatus according to claim 13, wherein the electrical conductor has a rectangular shape with recessed portions that are in contact with the first and second pads.

15. The electronic apparatus according to claim 13, wherein the electrical conductor is U-shaped with first and second ends that are in direct electrical contact with the first and second pads.

16. An electronic apparatus comprising:
    a package having walls for defining an inner space;
    first and second electronic devices located in the inner space and respectively having first and second pads;
    an electrical conductor that electrically connects the first and second pads, the electrical conductor being in the form of a liquid; and
    an electrical insulator that fills the inner space of the package to surround the electrical conductor, the electrical insulator having a light-curing property, wherein
    the electrical insulator completely fills a clearance between the electrical conductor and the walls of the package, and the electrical insulator is disposed so as to sandwich the electrical conductor between the first and second pads,
    the electrical conductor is formed by being poured within a space defined by the electrical insulator.

17. The electronic apparatus according to claim 16, wherein the electrical conductor has a rectangular shape with recessed portions that are in contact with the first and second pads.

18. The electronic apparatus according to claim 16, wherein the electrical conductor is U-shaped with first and second ends that are in direct electrical contact with the first and second pads.

* * * * *